US009287002B2

(12) United States Patent
Thomas (10) Patent No.: US 9,287,002 B2
(45) Date of Patent: Mar. 15, 2016

(54) BOOTSTRAP SAMPLING CIRCUIT WITH ACCURATELY AVERAGING PRE-CHARGE CIRCUIT

(71) Applicant: LINEAR TECHNOLOGY CORPORATION, Milpitas, CA (US)

(72) Inventor: David M. Thomas, Colorado Springs, CO (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 0 days.

(21) Appl. No.: 14/488,807

(22) Filed: Sep. 17, 2014

(65) Prior Publication Data

US 2015/0270013 A1    Sep. 24, 2015

Related U.S. Application Data

(60) Provisional application No. 61/955,566, filed on Mar. 19, 2014.

(51) Int. Cl.
  *G11C 27/02*  (2006.01)
  *H03K 17/06*  (2006.01)
  *H03K 17/16*  (2006.01)

(52) U.S. Cl.
  CPC ............ *G11C 27/028* (2013.01); *G11C 27/024* (2013.01); *H03K 17/063* (2013.01); *H03K 17/162* (2013.01); *H03K 17/165* (2013.01); *H03K 2217/0054* (2013.01)

(58) Field of Classification Search
  None
  See application file for complete search history.

(56) References Cited

U.S. PATENT DOCUMENTS 6,215,348 B1 *  4/2001  Steensgaard-Madsen .... 327/390
6,956,411 B1    10/2005  Holloway
(Continued)

FOREIGN PATENT DOCUMENTS

EP      2533249 A2    12/2012

OTHER PUBLICATIONS

European Patent Office 2015. Extended European Search Report dated Jun. 30, 2015, for counterpart European Patent Application 15000760.7, entitled "Bootstrap Sampling Circuit with Accurately Averaging Pre-Charge Circuit," filed Mar. 13, 2015, David M. Thomas, Inventor.

*Primary Examiner* — Long Nguyen
(74) *Attorney, Agent, or Firm* — McDermott Will & Emery LLP (57) ABSTRACT

A sampling circuit may include a sampling capacitance, an electronic sampling switch, and a switch controller. The electronic sampling switch may have a control input that controls whether the electronic sampling switch is in a sample state or a hold state. The electronic sampling switch may connect the sampling capacitance to an input signal while in the sample state and disconnect the sampling capacitance from the input signal while in the hold state. The switch controller may control the control input to the electronic sampling switch so as to cause the electronic sampling switch to be in the sample state during one period and the hold state during another period. While in the sample state, the switch controller may cause the impedance of the electronic sampling switch that is seen by the input signal to be substantially independent of the voltage of the input signal. The switch controller may include a pre-charge circuit that pre-charges the control input to the electronic sampling switch prior to each commencement of the sample state to approximately the average of the voltage of the input signal and the voltage on the sampling capacitance immediately prior to each commencement of the sample state. The amount of the pre-charging may be substantially independent of the voltage of the input signal.

13 Claims, 5 Drawing Sheets

(56) References Cited

U.S. PATENT DOCUMENTS

| | | |
|---|---|---|
| 8,482,442 B2 | 7/2013 | Thomas |
| 8,525,574 B1 * | 9/2013 | Duggal .......................... 327/94 |
| 8,681,192 B2 * | 3/2014 | Inoue et al. .................. 345/690 |
| 8,698,522 B2 | 4/2014 | Thomas |
| 8,723,556 B2 | 5/2014 | Thomas |
| 8,786,318 B2 | 7/2014 | Thomas |

\* cited by examiner

FIG. 3A (Prior Art) Input Signal

FIG. 3B (Prior Art) Hold Command

FIG. 3C (Prior Art) Sampled Signal

BOOTSTRAP SAMPLING CIRCUIT WITH ACCURATELY AVERAGING PRE-CHARGE CIRCUIT

CROSS-REFERENCE TO RELATED APPLICATION

This application is based upon and claims priority to U.S. provisional patent application 61/955,566, entitled "Improved Pre-Charge Circuit for Pulsed Bootstrap Sampling Circuit," filed Mar. 19, 2014. This application also relates to U.S. Pat. No. 8,482,442, entitled "System and Methods to Improve the Performance of Semiconductor Based Sampling System," issued Jul. 9, 2013. The entire content of this provisional patent application and patent is incorporated herein by reference.

BACKGROUND

1. Technical Field

This disclosure relates to electronic sampling systems and to reducing signal distortions in such systems.

2. Description of Related Art

Electronic sampling systems have a wide range of applications, such as in MP3 players, DVD players, cellular telephones, data acquisition systems, test and measurement systems, and control systems. Electronic sampling systems may be found in a wide variety of sub-systems, such as analog-to-digital converters, switched capacitor networks, signal acquisition circuitry, and comparators.

Electronic sampling systems may employ sample and hold circuits that sample a voltage and maintain it in a storage device so that another circuit can measure or otherwise observe the acquired voltage. However, the mere act of sampling a signal of interest can cause distortion of the sampled signal and, in turn, in its sampling. This distortion can limit the useful voltage and/or frequency range of the input signal to be sampled.

This distortion may be produced by various factors, such as non-linear resistance characteristics of one or more switches in the sample and hold circuits, effects associated with turnoff thresholds, bulk effect, switch ratio match variations, and process variations. Distortion may also be produced by parasitic capacitances of switches in the sampling circuits, signal dependent charge injection by switches in the sampling circuits, and/or non-linear load currents flowing through input source resistances.

Efforts have been made to reduce such distortion, such as are described in U.S. Pat. No. 8,482, 442, entitled "System and Methods to Improve the Performance of Semiconductor Based Sampling System," issued Jul. 9, 2013. However, these approaches can still result in distortion.

SUMMARY

A sampling circuit may include a sampling capacitance, an electronic sampling switch, and a switch controller.

The electronic sampling switch may have a control input that controls whether the electronic sampling switch is in a sample state or a hold state. The electronic sampling switch may connect the sampling capacitance to an input signal while in the sample state. The electronic sampling switch may disconnect the sampling capacitance from the input signal while in the hold state.

The switch controller may control the control input to the electronic sampling switch so as to cause the electronic sampling switch to be in the sample state during one period and the hold state during another period. While in the sample state, the switch controller may cause the impedance of the electronic sampling switch that is seen by the input signal to be substantially independent of the voltage of the input signal. The switch controller may include a pre-charge circuit that pre-charges the control input to the electronic sampling switch prior to each commencement of the sample state to approximately the average of the voltage of the input signal and the voltage on the sampling capacitance immediately prior to each commencement of the sample state. The amount of the pre-charging may be substantially independent of the voltage of the input signal.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps that, unless otherwise indicated, perform in the same manner.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Figure 1:
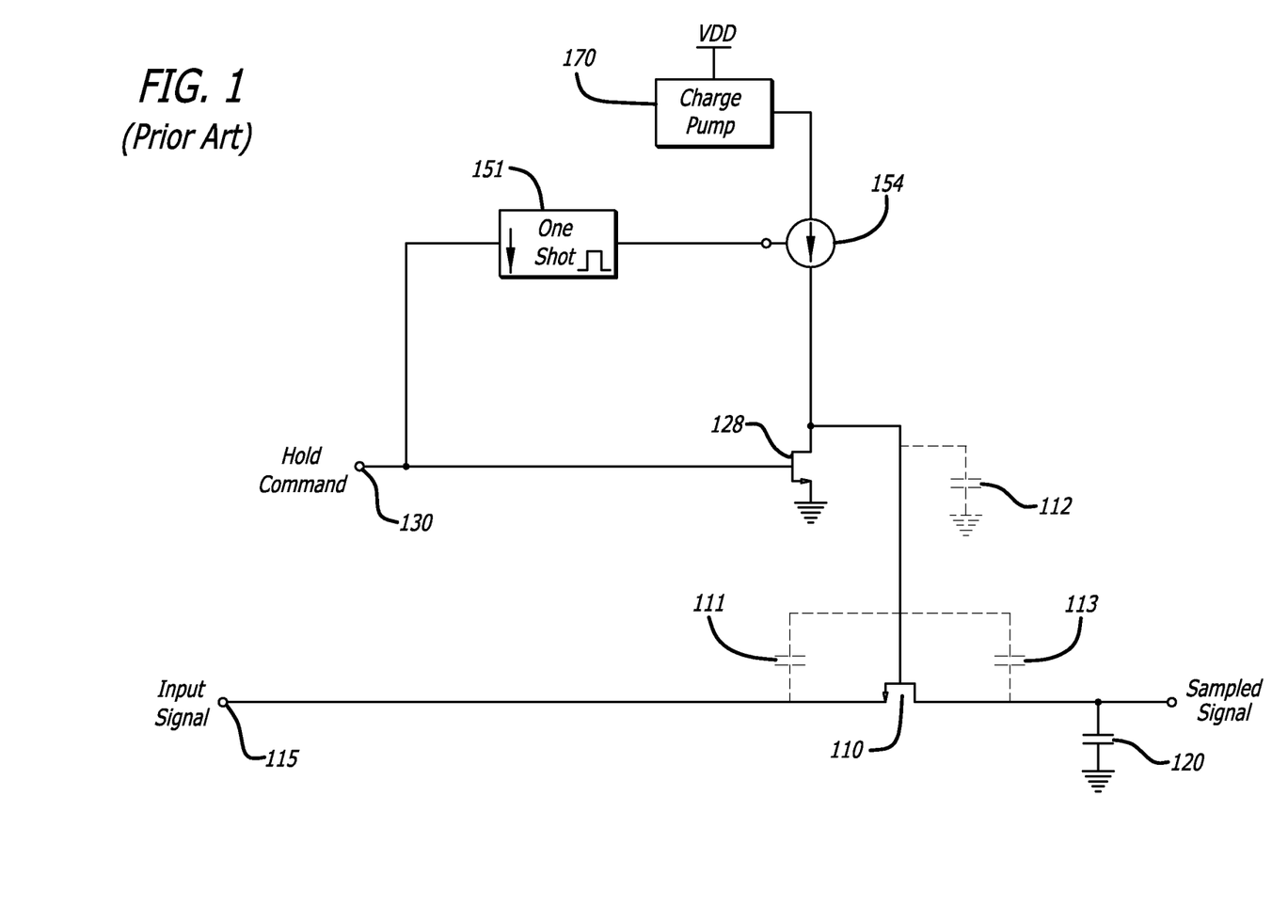
FIG. 1 illustrates an example of a prior art sampling circuit.

FIG. 1 illustrates an example of a prior art sampling circuit. An electronic sampling switch 110 operates in a closed sample state and an open hold state, controlled by a control signal at its gate terminal. During the sample state, an input signal at a signal input 115 is transferred through the electronic sampling switch 110 to a sampling capacitor 120. During the hold state, the input signal is isolated from the sampling capacitor 120. The voltage on the sampling capacitor 120 is available for observation and/or further signal processing by subsequent circuitry.

During the sample state, it may be desirable to have the lowest possible resistance for the electronic sampling switch 110, so that the voltage on the sampling capacitor 120 can accurately track a fast moving input signal. Additionally, for accurate tracking of the input signal, there may be minimal variation in the resistance of the electronic sampling switch 110 as it tracks the input voltage. This may require the highest allowable gate to source voltage and a gate to source voltage that remains largely fixed in the face of variations in the input signal level.

A Hold Command may be received at a hold command input 130. When high, an electronic switch 128 is on and the gate of the electronic sampling switch 110 is low. This causes the electronic sampling switch 110 to be in an open, non-conductive state and, in turn, the input signal to be isolated from the sampling capacitor 120. As the Hold Command transitions from high to low, the electronic switch 128 turns off and a one shot circuit 151 is triggered. The one shot circuit 151 outputs a short pulse which activates a gated current source 154 that is supplied by a charge pump 170. The gated current source 154 turns on for the duration of the one shot pulse, delivering current to the gate of the electronic sampling switch 110.

The gate of the electronic sampling switch 110 begins to rise the instant that current starts to flow from the gated current source 154, and continues to rise until the gated current source 154 is turned off at the end of the one shot pulse. At this time, the gate of the electronic sampling switch 110 is at its maximum voltage and the electronic sampling switch 110 is in the conductive state with minimum resistance. The gate is capacitively coupled to the drain and source of the electronic sampling switch 110 by intrinsic gate capacitances 111 and 113. Therefore, the gate also tracks the input signal during the sample state, resulting in a substantially constant gate to source voltage, regardless of input voltage.

At the end of the sample state, the Hold Command returns to high and the electronic switch 128 pulls the gate on the electronic sampling switch 110 to ground, causing the input signal that was present at the end of the sample state to be stored on the sampling capacitor 120.

The gated current source 154 which is controlled by the one shot circuit 151 essentially operates as a charge generator, in which the delivered charge, QP, is the current source magnitude, IP, times the one shot time, TP. If the electronic sampling switch 110 has a gate capacitance of CSW, then the gate overdrive will be QP/CSW. By carefully controlling the one shot time or the current source magnitude to account for variations in processing, supply voltage, temperature, and other variables, a precise gate overdrive can be achieved.

The above description is somewhat idealized since it does not take into account parasitic capacitance. All circuitry has associated parasitic capacitance, as do the gated current source 154 and the electronic switch 128. This is depicted in FIG. 1 as a parasitic capacitance 112. The charge calculation for setting the gate voltage of the electronic sampling switch 110 must account for this. If the input signal has a relatively small magnitude, as compared to the gate overdrive voltage, then this may be a minor adjustment to either the gated current source 154 magnitude or the one shot circuit 151 time. This can be accomplished with replica control circuits. However, if the magnitude of the input signal is comparable to the gate overdrive, then something more may need to be done.

For illustration, assume the following practical values to this circuit.
   Input voltage range: 0.5 to 1.5V
   Sampling switch gate capacitance: 1 pf
   Parasitic capacitance: 0.1 pF
   Gate overdrive during sampling: 1.8V
   Turn on time 200 ps
If the control circuit uses a replica circuit to generate 1.8V of overdrive at the mid-point of the operating range, 1.0V, then the charge generator must supply approximately 1.8V*1 pf for the gate overdrive, plus an additional (1.8V+1V)*0.1 pf for the parasitic capacitance, or a total of 2.08 pc of charge. This quantity of charge will be delivered regardless of the input voltage level.

Now, if the input voltage is at the lower end of the range, 0.5V, 2.08 pc of charge is delivered to the gate, the gate will have 1.845V of overdrive, since less charge was used lifting the gate from ground to the input voltage level, leaving more charge to be put into the gate overdrive. Similarly, if the input voltage level is 1.5V, 2.08 pc is delivered, and the gate now has 1.754V of overdrive since more charge was used lifting the gate from ground to the input voltage level. This variation in overdrive voltage can be referred to as start dependent overdrive. Start dependent overdrive may result in signal distortion, as a variation in the gate overdrive voltage may result in variation in the channel resistance. Channel resistance may therefore be dependent on the start voltage and can lead to distortion of the sampled signal Start dependent overdrive may be greatly reduced if the gate was preset to a starting point such that a predetermined quantity of charge would result in a constant overdrive, regardless of input signal level. One possibility is to short the gate to the input terminal momentarily just prior to the charge generator delivering charge to the gate terminal of the electronic sampling switch 110. This pre-charges the parasitic capacitance 112 to the input voltage and the charge is supplied by the input signal. Then, when the charge generator supplies charge to the gate, it only needs to supply what is needed for the overdrive voltage. This method may work well for slow moving signals relative to the sampling rate, meaning that the new input voltage to be sampled is not much different from the previous sample.

In cases where there is a significant voltage difference between the current sample and the previous sample, the overdrive voltage may have significant variation when pre-charging to the input terminal. For example, if the current sample is 1.5V and the previous sample was 0.5V, as the gate is pre-charged to 1.5V, the electronic sampling switch terminal that is connected to the sampling capacitor 120 is lower, 0.5V, and thus becomes the source (for an N-channel switch). A 1V gate to source voltage is enough to cause current flow, so the sampling capacitor begins to charge. Additionally, any parasitic capacitance has been pre-charged to 1.5V, even though the other side of the switch is still essentially at 0.5V. The result is a higher than desired overdrive voltage. Conversely, if the new sample is 0.5V and the old sample is 1.5V, the gate overdrive voltage is lower than desired.

This variation could be greatly reduced if the pre-charge voltage was a function of the new sample and the previous sample.

Figure 2:
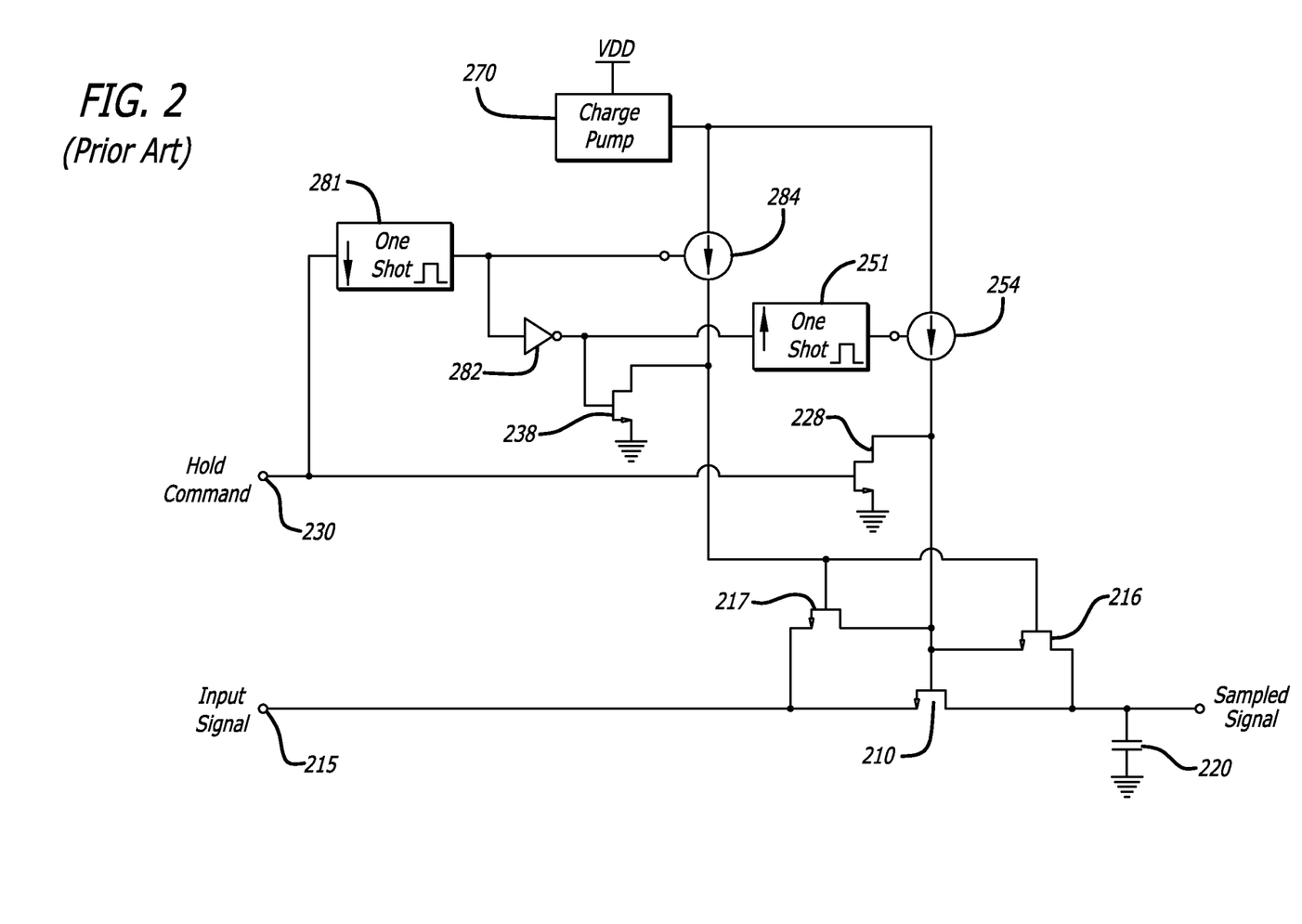
FIG. 2 illustrates an example of a prior art sampling circuit that generates a pre-charge voltage that is a function of a new input signal to be sampled and a previous sample.

FIG. 2 illustrates an example of a prior art sampling circuit that generates a pre-charge voltage that is a function of a new input signal to be sampled and a previous sample. A pre-charge electronic switch 216 controllably connects the gate of an electronic sampling switch 210 to an input terminal 215 for an input signal, and a pre-charge electronic switch 217 controllably connects the gate of the electronic sampling switch 210 to a sampling capacitor 220. The pre-charge electronic switches 216 and 217 act as resistors during the pre-charge state, driving the gate of the electronic sampling switch 210 to a function of the previous sample and the new sample.

This circuit may also work well for situations where the new sample and the previous sample are not significantly different. It is significantly better than pre-charging only to the input terminal for situations where there is a large difference between samples. However there may still be significant gate overdrive variation.

Figure 3A:
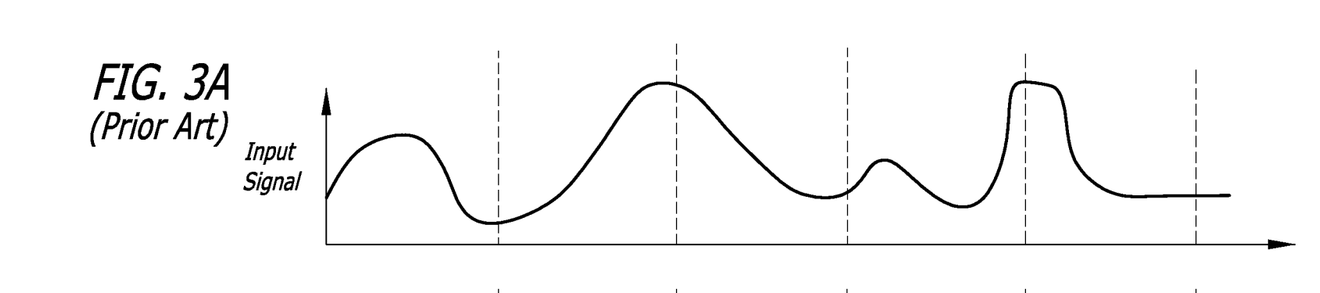
FIG. 3A illustrates an example of an input signal that might be delivered to the input terminal of the circuit illustrated in FIG. 2.
Figure 3B:
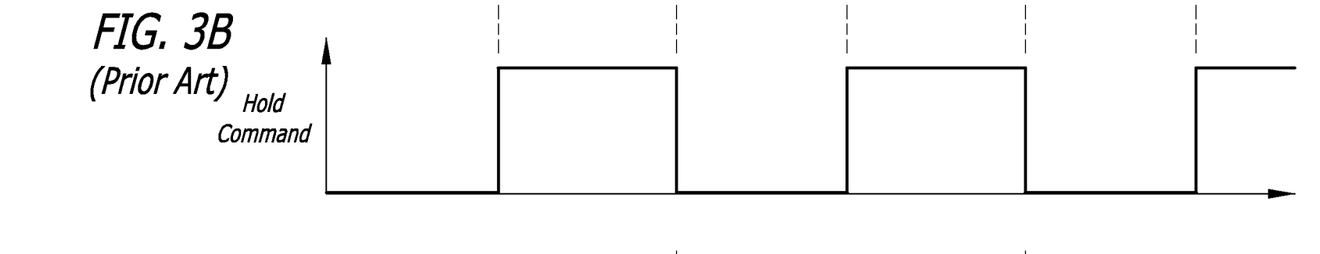
FIG. 3B illustrates an example of a Hold Command that might be delivered to the hold command input of the same circuit.
Figure 3C:
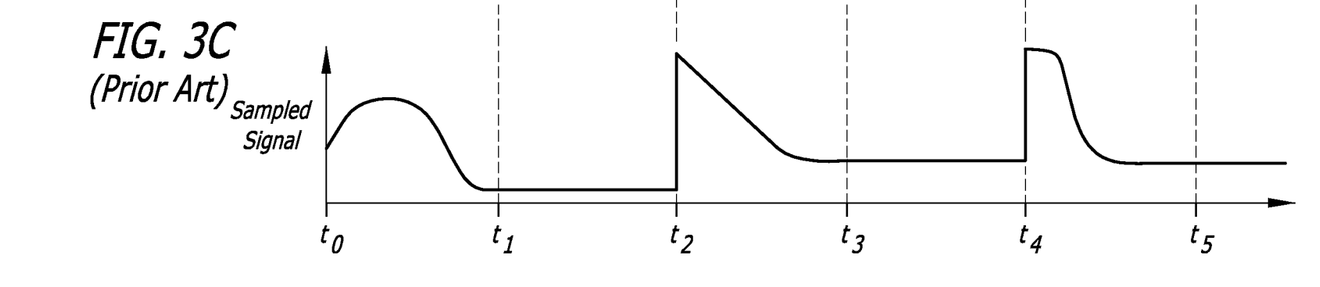
FIG. 3C illustrates a Sampled Signal that might result across the sampling capacitor illustrated in FIG. 2.

FIG. 3A illustrates an example of an input signal that might be delivered to the input terminal 215 of the circuit illustrated in FIG. 2; FIG. 3B illustrates an example of a Hold Command that might be delivered to a hold command input 230 of the same circuit; and FIG. 3C illustrates a Sampled Signal that might result across the sampling capacitor 220 illustrated in FIG. 2. When the Hold Command is low, the sampling capacitor 220 tracks the input signal. When the Hold Command is high, the input signal is isolated from the sampling capacitor 220. When the Hold Command transitions from high to low, as when the electronic sampling switch 210 transitions from non-conducting to conducting, the gate of the electronic sampling switch 210 has become pre-charged, just prior to the delivery of the predetermined gate charge, QP.

Referring again to FIG. 3, t2 is a moment that the Hold Command transitions from high to low starting a new sample state. The new sample is high and the stored sample is low. Referring back to FIG. 2, as the pre-charge signal goes high momentarily, the pre-charge electronic switch 216 will have a higher overdrive than the pre-charge electronic switch 217. In turn, this means that the pre-charge electronic switch 216 will have a lower resistance than the pre-charge electronic switch 217. As a result, the voltage at the gate will be lower than the mid-point between the new sample and the old sample. This is an inaccurate average of the input and output terminals of the sampling switch and may result in an inaccurate overdrive voltage.

Figure 4:
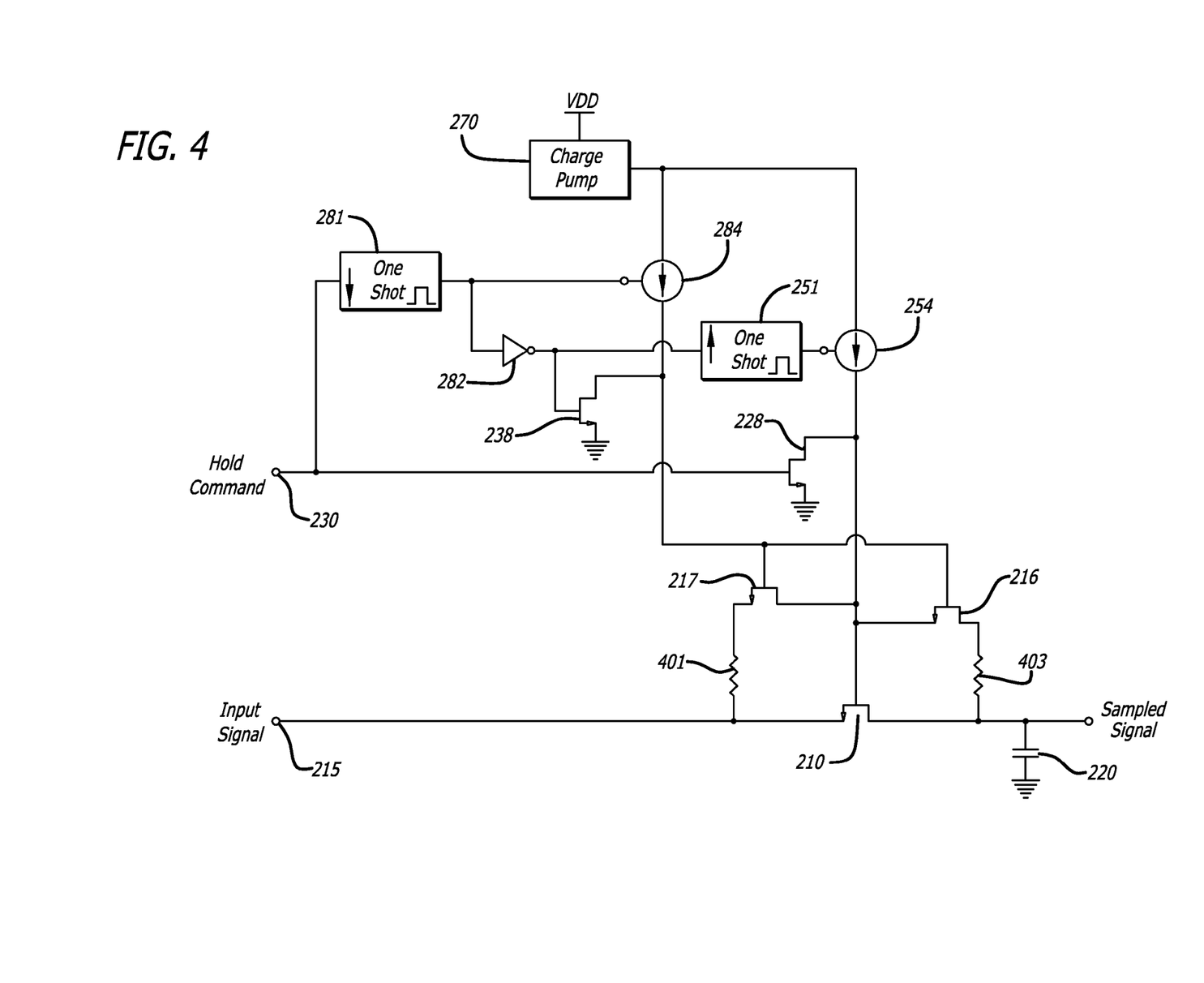
FIG. 4 illustrates an example of a sampling circuit that uses averaging resistors to generate a pre-charge voltage that is very close to the average of a new input signal to be sampled and a previous sample.

FIG. 4 illustrates an example of a sampling circuit that uses averaging resistors 401 and 403 to generate a pre-charge voltage that is much closer to the average of a new input signal to be sampled and a previous sample. The circuit is the same as the one illustrated in FIG. 2, except that the averaging resistors 401 and 403 have been added in series with the pre-charge electronic switches 216 and 217, respectively, to improve the accuracy of the pre-charge voltage averager. The averaging resistors may have a resistance that is substantially larger than the channel resistance of the pre-charge electronic switches 216 and 217. Larger resistors value, as compared to the switch channel resistance, may result in a more accurate average This improves the accuracy of the pre-charge gate voltage, by making it closer to the average of a new input signal to be sampled and a previous sample. As mentioned above, the accuracy of the voltage average may depend on the relative ratio of the channel resistance of switches 216 and 217 to the resistance of the averaging resistors. Accuracy may increase as the switch channel resistance becomes small compared to the resistance of the averaging resistors. The average may become perfect as this ratio approaches infinity. However, it may also increase the impedance of the pre-charge circuit with respect to using only pre-charge switches, as shown in FIG. 2. This can result in significantly slower operation, which can be a problem for high speed sampling circuits.

Figure 5:
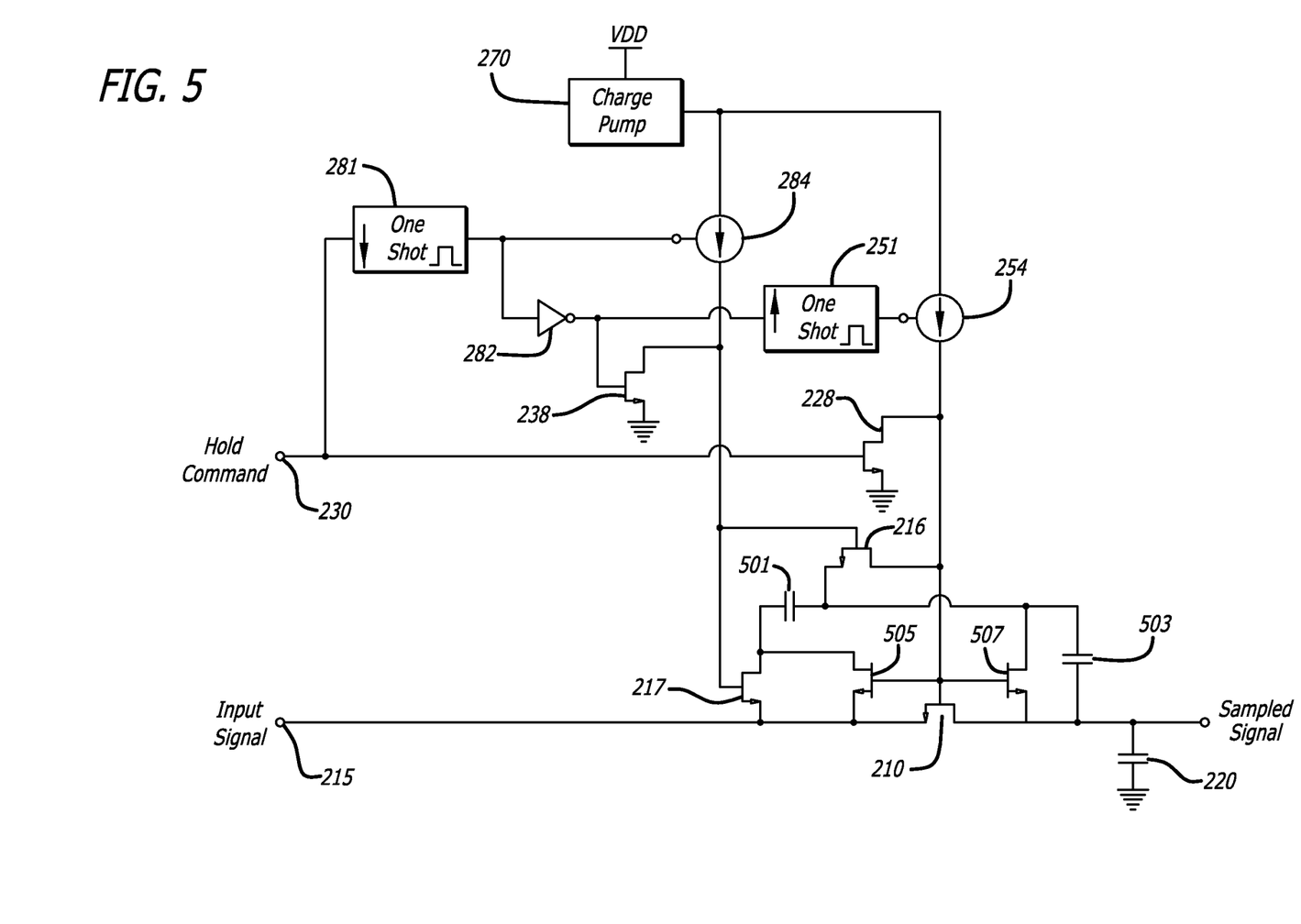
FIG. 5 is an example of a sampling circuit that uses averaging capacitors to generate a pre-charge voltage that is very close to the average of a new input signal to be sampled and a previous sample.

FIG. 5 is an example of a sampling circuit that uses averaging capacitors 501 and 503 to generate a pre-charge voltage that is very close to the average of a new input signal to be sampled and a previous sample. Again, the circuit is the same as the one illustrated in FIG. 2, except that the averaging capacitors 501 and 503 are added along with reset electronic switches 505 and 507. The averaging capacitors may be large enough such that, the variation in charge used to pre-charge the gate of the sampling switch 210, over the input range, does not result in a significant variation in the average voltage. For example, using the values listed in paragraph the variation in charge required to pre-charge the gate, across the input range is 0.1 pC, 0.1 pF times the input range of 1V. If the capacitors are 4 pF each, then this may result in a 12.5 mV variation in the average voltage. To follow the operation of this circuit, assume the circuit being in a sample state. The gate of the electronic sampling switch 210 is high, and the electronic sampling switch 210 and electronic switches 505 and 507 are conductive. During a sample state, the averaging capacitors 501 and 503 are fully discharged by the electronic switches 505 and 507. When the Hold Command transitions from low to high, an electronic switch 228 is turned on, pulling the gates of the electronic switches 210, 505 and 507 to ground, turning them all off. The circuit is now in the hold state and the sampling capacitor 210 is isolated from the input terminal 215. The averaging capacitors 501 and 503, which were discharged during the sample state, remain discharged in the hold state. Now, the Hold Command transitions from high to low. After being inverted by an inverter 282, this grounds and turns off the electronic switch 228 and triggers a pre-charge one shot 281.

This turns a pre-charge electronic switch 238 off and causes a gated current source 284 fed by a charge pump 270 to output a pulse of current. The current from the gated current source 284 pulls up the gate of the electronic switch 505, turning it on. This now has the series connection of the averaging capacitors 501 and 503, connected between the input terminal and the output terminal of the electronic sampling switch 210. Since both of the averaging capacitors 501 and 503 were previously discharged and are of equal value, the averaging capacitors may equally divide the voltage across the electronic sampling switch 210. At the same time during the pre-charge phase, current from the gated current source 284 also turns on the pre-charge electronic switch 216, connecting the gate of the electronic sampling switch 210 to the junction between the averaging capacitors 501 and 503, i.e. the average of the voltage at the input and output terminals of the electronic sampling switch 210. At the end of the pre-charge state, the pre-charge one shot 281 returns to low, turning the pre-charge electronic switch 238 on, thus turning off the pre-charge electronic switches 216 and 217. The end of the pre-charge state also triggers a one shot 251, causing a gated current source 254 to deliver a pre-determined charge, QP, to the gates of the electronic switches 505, 507 and 210. The circuit is now again in the sample state and the averaging capacitors 501 and 503 are again discharged.

Using averaging capacitors (FIG. 5) instead of averaging resistors (FIG. 4) may provide a much lower impedance over the very short duration of the pre-charge state. This may result in higher speed operation of the overall sampling system.

The various electronic switches that have been described may be of any type, such as FETs or MOS FETs. Various adjustments to the circuits may be needed, depending upon the type of electronic switch and whether N or P type is used.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A sampling circuit comprising:
 a sampling capacitor;
 an electronic sampling switch that:
  has a control input that controls whether the electronic sampling switch is in a sample state or a hold state;
  connects the sampling capacitor to an input signal while in the sample state; and
  disconnects the sampling capacitor from the input signal while in the hold state;
 a switch controller that:
  controls the control input to the electronic sampling switch so as to cause the electronic sampling switch to be in the sample state during one period and the hold state during another period;
  while in the sample state, causes the impedance of the electronic sampling switch that is seen by the input signal to be substantially independent of the voltage of the input signal;
  includes a pre-charge circuit that pre-charges the control input to the electronic sampling switch prior to each commencement of the sample state to approximately the average of the voltage of the input signal and the voltage on the sampling capacitor immediately prior to each commencement of the sample state, the amount of the pre-charging being substantially independent of the voltage of the input signal,
 wherein
  the electronic sampling switch includes a sampling field effect transistor (FET),
  the control input is the gate of the sampling FET,
  the pre-charge circuit includes two pre-charge FETs,
  only while the control input to the electronic sampling switch is being pre-charged:
   one of the pre-charge FETs is turned on and closes a current path between the input signal and the gate; and
   the other pre-charge FETs is turned on and closes a current path between the input signal and the sampling capacitor;
  the current path between the input signal and the gate includes a resistor; and
  the current path between the input signal and the sampling capacitor includes a resistor.

2. The sampling circuit of claim 1 wherein both resistors have substantially the same resistance.

3. The sampling circuit of claim 1 wherein each resistor has a resistance that is substantially larger than the on resistance of the FET that closes the current path that contains the resistor.

4. The sampling circuit of claim 1 wherein the pre-charge circuit includes an input capacitor associated with the input signal and a sample capacitor associated with the sampling capacitor.

5. The sampling circuit of claim 4 wherein the pre-charge circuit causes charge to be transferred between the gate and the input capacitor and between the gate and the sample capacitor prior to each commencement of the sample state.

6. The sampling circuit of claim 5 wherein the pre-charge circuit causes charge on the input capacitor and charge on the sample capacitor to be initialized during each sample state.

7. The sampling circuit of claim 6 wherein the pre-charge circuit causes the charge on the input capacitor and the charge on the sample capacitor to be initialized to approximately zero during each sample state.

8. The sampling circuit of claim 6 wherein the input capacitor and the sample capacitor are connected in series.

9. The sampling circuit of claim 8 wherein:
the series connection of the input capacitor and the sample capacitor includes a connection point between the input capacitor and the sample capacitor; and
the pre-charge circuit includes a pre-charge electronic switch that controllably connects the connection point to the gate.

10. The sampling circuit of claim 1 further comprising a pre-charge one-shot pulse circuit that generates a pre-charge one shot pulse in response to a sample/hold signal.

11. The sampling circuit of claim 10 wherein the pre-charge one-shot pulse causes the pre-charge circuit to pre-charge the control input to the electronic sampling switch.

12. The sampling circuit of claim 11 further comprising a sampling one-shot pulse circuit that generates a sampling one shot pulse that causes the control input to the electronic sampling switch to cause the electronic sampling switch to be in the sample state.

13. The sampling circuit of claim 12 wherein the sampling one shot pulse circuit initiates the sampling one shot pulse in response to termination of the pre-charge one-shot pulse.

* * * * *